(12) United States Patent
Hyun et al.

(10) Patent No.: US 11,586,064 B2
(45) Date of Patent: Feb. 21, 2023

(54) DISPLAY APPARATUS REALIZING A LARGE-SIZE IMAGE

(71) Applicant: LG Display Co., Ltd., Seoul (KR)

(72) Inventors: Joo Bong Hyun, Seoul (KR); Hoon Kang, Goyang-si (KR); Sung Woo Kim, Seoul (KR); Ju Hoon Jang, Paju-si (KR); Won Sik Lee, Usan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/550,964

(22) Filed: Dec. 14, 2021

(65) Prior Publication Data
US 2022/0206331 A1  Jun. 30, 2022

(30) Foreign Application Priority Data
Dec. 31, 2020 (KR) .................. 10-2020-0189745

(51) Int. Cl.
*G02F 1/1333* (2006.01)
*G02F 1/1335* (2006.01)
*G02F 1/13357* (2006.01)

(52) U.S. Cl.
CPC .... *G02F 1/133357* (2021.01); *G02F 1/13336* (2013.01); *G02F 1/133504* (2013.01); *G02F 1/133604* (2013.01); *G02F 1/133611* (2013.01)

(58) Field of Classification Search
CPC ........... G02F 1/133357; G02F 1/13336; G02F 1/133504; G02F 1/133604; G02F 1/133611

USPC .................................................... 349/73–74
See application file for complete search history.

(56) References Cited

U.S. PATENT DOCUMENTS

2016/0044751 A1* 2/2016 Ikeda .................... G06F 1/1652
362/227

FOREIGN PATENT DOCUMENTS

| KR | 10-2009-0041125 A | 4/2009 |
| KR | 10-2016-0067275 A | 6/2016 |
| KR | 10-2019-0078995 A | 7/2019 |

* cited by examiner

*Primary Examiner* — Charles S Chang
(74) *Attorney, Agent, or Firm* — Birch, Stewart, Kolasch & Birch, LLP

(57) ABSTRACT

A display apparatus can include a plurality of first display panels arranged in a grid, the plurality of first display panels including display areas having a plurality of first sub-pixels and bezel areas free of sub-pixels; and a second display panel stacked on the plurality of first display panels, and including emission areas and transparent transmission areas, in which the emission areas of the second display panel include a plurality of second sub-pixels arranged in a grid overlapping with the bezel areas of the first display panels, and the transparent transmission areas of the second display panel overlap with the plurality of first sub-pixels in the plurality of first display panels.

20 Claims, 4 Drawing Sheets

DISPLAY APPARATUS REALIZING A LARGE-SIZE IMAGE

CROSS REFERENCE TO RELATED APPLICATION

This application claims priority to Korean Patent Application No. 10-2020-0189745 filed in the Republic of Korea on Dec. 31, 2020, the entire contents of which are hereby incorporated by reference as if fully set forth into the present application.

BACKGROUND OF THE INVENTION

Field of the Invention

The present disclosure relates to a display apparatus capable of providing a large-size image of high quality to a user.

Discussion of the Related Art

Generally, a display apparatus is provided to realize an image. For example, the display apparatus can include a display panel in which light-emitting devices are formed. Each of the light-emitting devices can emit light displaying a specific color. For example, each of the light-emitting devices can include a light-emitting layer disposed between two electrodes.

The display panel can include a display area in which the light-emitting devices are disposed, and a bezel disposed outside of the display area. A panel driver providing a signal for realizing the image to the display area can be disposed in the bezel area. For example, a scan driver can be disposed in the bezel area.

The display apparatus can include a plurality of such display panels to realize a large-size image. For example, the display panels can be disposed side by side. In the display apparatus, the image provided to the user can be divided by the bezel area of each display panel. The display apparatus can prevent the bezel area of each display panel from being recognized by the user using the light, which is emitted from the light-emitting devices of each display panel.

However, in the display apparatus, the quality and the resolution of the image provided to the user may be degraded. For example, multiple display panels can be arranged together in order to provide a large area for displaying an image, but due to "dead space" corresponding to the bezel areas between the display panels (e.g., where no sub-pixels exist), a user may recognize a discontinuity defect or a non-uniformity in the displayed image.

SUMMARY OF THE INVENTION

Accordingly, the present disclosure is directed to a display apparatus that substantially obviates one or more problems due to limitations and disadvantages of the related art.

An object of the present disclosure is to provide a display apparatus capable of providing a large-size image of high quality to a user without a sense of incongruity.

Another object of the present disclosure is to provide a display apparatus capable of preventing the bezel area of each display panel from being recognized by the user without degrading the resolution.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose(s) of the invention, as embodied and broadly described herein, there is provided a display apparatus comprising a first device substrate according to an example of the invention. The first device substrate can include a display area and a bezel area. The bezel area can be disposed outside the display area. First light-emitting devices can be disposed on the display area of the first device substrate. The first light-emitting devices can be covered by a first encapsulating element. A second device substrate can be disposed on the first encapsulating element. The second device substrate can include a transmission area and an emission area. The transmission area of the second device substrate can overlap the display area of the first device substrate. The emission area of the second device substrate overlaps the bezel area of the first device substrate. At least one second light-emitting device can be disposed on the emission area of the second device substrate. A parallel light generating element can be disposed between the first encapsulating element and the second device substrate. The light emitted from each light-emitting device can be converted to a parallel light by the parallel light generating element.

A device adhesive layer can be disposed between the parallel light generating element and the second device substrate.

The parallel light generating element can include transparent lenses and a lens planarization layer. The transparent lenses can be disposed on the first light-emitting device. The lens planarization layer can cover the transparent lenses.

The refractive index of the lens planarization layer can be less than the refractive index of each transparent lens.

A diffusion sheet can be disposed on the second device substrate. The diffusion sheet can overlap the display area of the first device substrate.

The diffusion sheet can be spaced apart from the emission area of the second device substrate.

A second encapsulating element can be disposed on the second device substrate. The second encapsulating element can cover the second light-emitting device. The diffusion sheet can be disposed between the second device substrate and the second encapsulating element.

A signal wire can be disposed on the second device substrate. The signal wire can be disposed between the first light-emitting devices.

A three-dimensional (3D) optical element can be disposed on the second light-emitting device. The 3D optical element can extend on the transmission area of the second device substrate.

The 3D optical element can include lenticular lenses and a lens passivation layer. The lens passivation layer can cover the lenticular lenses.

In another embodiment, there is provided a display apparatus including first display panels. Each of the first display panels can include a display area and a bezel area. The first display panels can be disposed side by side. A second display panel can be disposed on the first display panels. The second display panel can include a transmission area and an emission area. The transmission area of the second display panel can overlap with the display area of each of the first display panels. The emission area of the second display panel can overlap with the bezel area of each of the first display panels. A plurality of first light-emitting devices and a parallel light generating element can be stacked on the display area of each of the first display panels.

The parallel light generating element of each of the first display panels can include glass fiber. The glass fiber of each of the first display panels can extend toward the second display panel from the corresponding first display panel.

The second display panel can include a device substrate and at least one second light-emitting device. The device substrate can support the second light-emitting device. The second light-emitting device can be disposed in the emission area of the second display panel. The transmission area of the device substrate can have a thickness thinner than the emission area of the device substrate.

The parallel light generating element of each the first display panels can be spaced away from the bezel area of the corresponding first display panel. A thickness difference between the transmission area and the emission area can be the same as a thickness of the parallel light generating element.

The second display panel can include a thin film transistor and a light-blocking pattern. The thin film transistor can be electrically connected to the second light-emitting device. The light-blocking pattern can be disposed between the device substrate and a semiconductor pattern of the thin film transistor. The thin film transistor and the light-blocking pattern can be spaced away or spaced apart from the transmission area.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
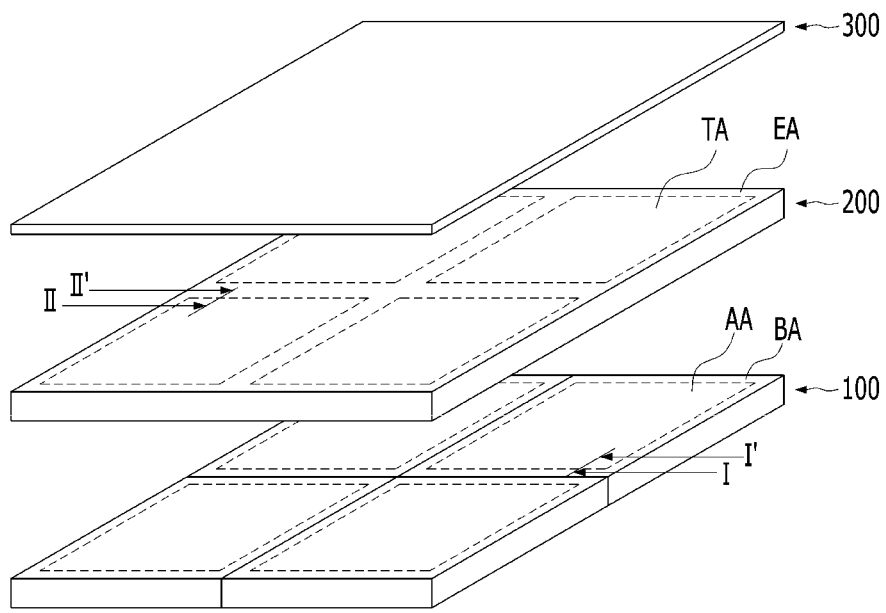
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2:
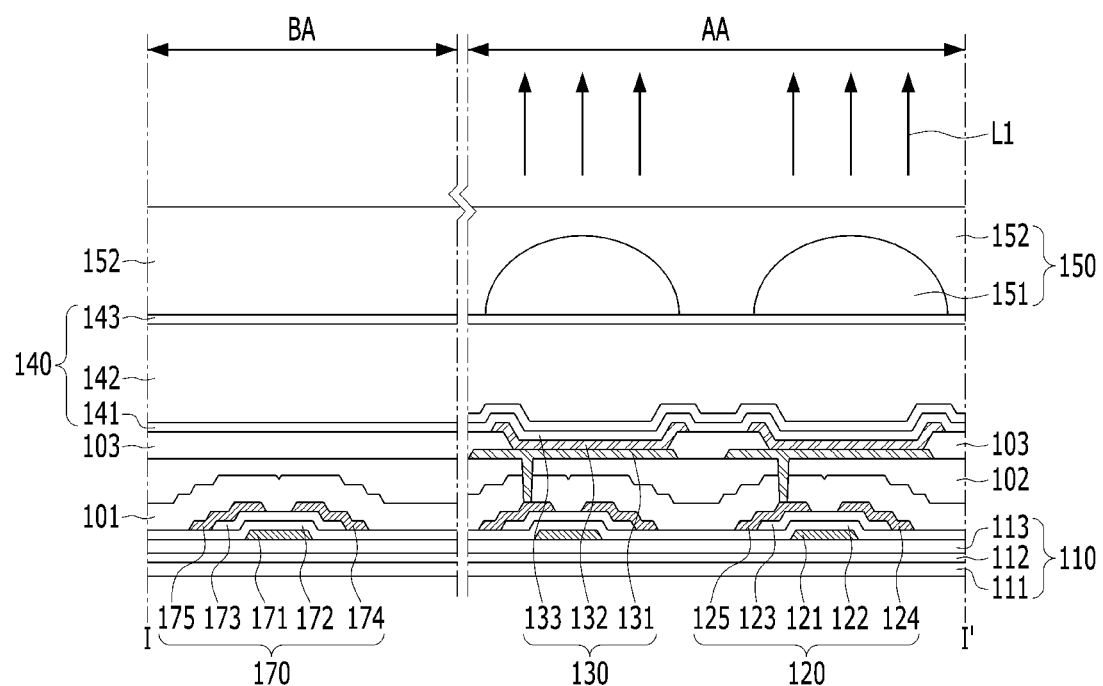
FIG. 2 is a view taken along line I-I' of FIG. 1 according to an embodiment of the present disclosure.
Figure 3:
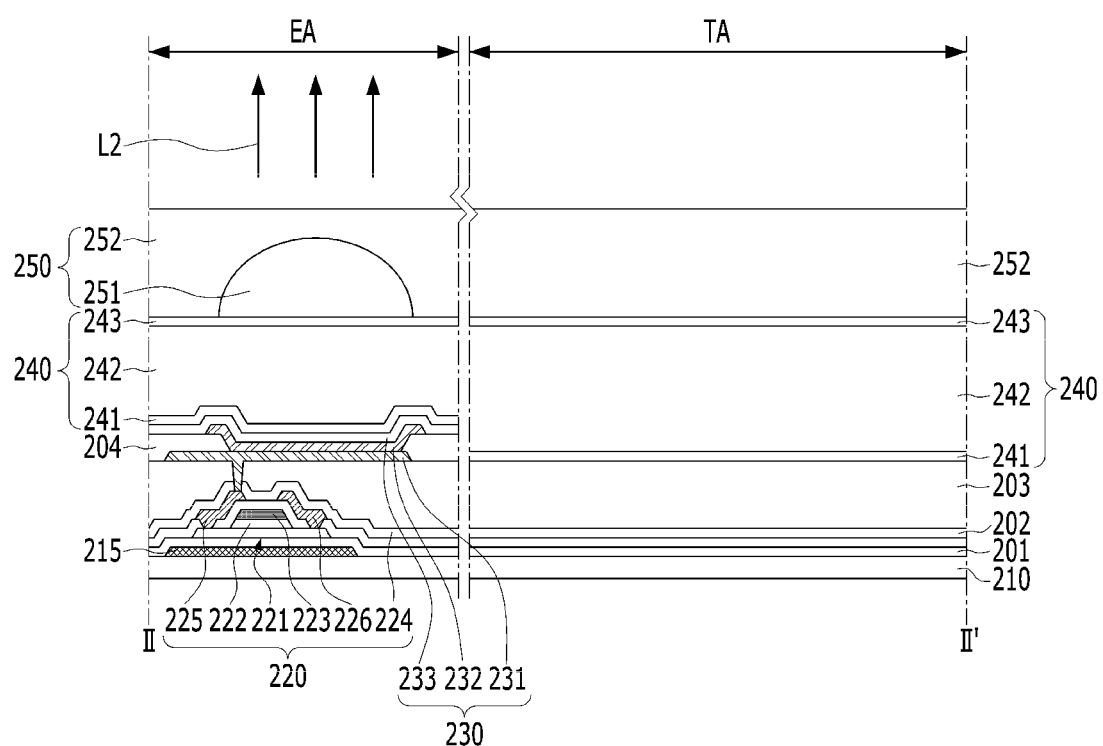
FIG. 3 is a view taken along line II-II' of FIG. 1 according to an embodiment of the present disclosure.

FIG. 1 is a view schematically showing a display apparatus according to an embodiment of the present disclosure. FIG. 2 is a view taken along line I-I' of FIG. 1. FIG. 3 is a view taken along line II-II' of FIG. 1. All the components of each display apparatus according to all embodiments of the present disclosure are operatively coupled and configured.

Referring to FIGS. 1 to 3, the display apparatus according to the embodiment of the present disclosure can include first display panels 100, a second display panel 200 and a diffusion sheet 300. The first display panels 100 can be disposed side by side. Each of the first display panels 100 can realize a portion of a large-size image provided to a user. For example, each of the first display panels 100 can include a first light-emitting device 130 on a first device substrate 110.

The first device substrate 110 can have a multi-layer structure. For example, the first device substrate 110 can have a stacked structure of a first substrate layer 111, a substrate insulating layer 112 and a second substrate layer 113. The second substrate layer 113 can include the same material as the first substrate layer 111. For example, the first substrate layer 111 and the second substrate layer 113 can include a polymer material, such as poly-imide (PI). The substrate insulating layer 112 can include an insulating material. Thus, in the display apparatus according to the embodiment of the present disclosure, the first device substrate 110 can have high flexibility. Therefore, in the display apparatus according to the embodiment of the present disclosure, the damage of the first light-emitting devices 130 due to an external impact can be prevented.

Each of the first light-emitting devices 130 can emit light displaying a specific color (e.g., red, green, blue). For example, each of the first light-emitting devices 130 can include a first lower electrode 131, a first light-emitting layer 132 and a first upper electrode 133, which are sequentially stacked on the first device substrate 110.

The first lower electrode 131 can include a conductive material. The first lower electrode 131 can include a material having high reflectance. For example, the first lower electrode 131 can include a metal, such as aluminum (Al) and silver (Ag). The first lower electrode 131 can have a multi-layer structure. For example, the first lower electrode 131 can have a structure in which a reflective electrode formed of a metal is disposed between transparent electrodes formed of a transparent conductive material, such as ITO and IZO.

The first light-emitting layer 132 can generate light having luminance corresponding to a voltage difference between the first lower electrode 131 and the first upper electrode 133. For example, the first light-emitting layer 132 can include an emission material layer (EML) having an emission material. The emission material can include an organic material, an inorganic material or a hybrid material. For example, the first display panels 100 of the display apparatus according to the embodiment of the present disclosure can be an organic light-emitting display panel including the light-emitting layer formed of an organic material. The first light-emitting layer 132 can have a multi-layer structure. For example, the first light-emitting layer 132 can further include at least one of a hole injection layer (HIL), a hole transport layer (HTL), an electron transport layer (ETL) and an electron injection layer (EIL). Therefore, in each first display panel 100 of the display apparatus according to the embodiment of the present disclosure, the luminous efficiency of the first light-emitting devices 130 can be improved.

The first upper electrode 133 can include a conductive material. The first upper electrode 133 can include a material different than the first lower electrode 131. The first upper electrode 133 can have a transparency higher than the first lower electrode 131. For example, the first upper electrode 133 can be a transparent electrode including a transparent conductive material, such as ITO and IZO. Thus, in each first display panel 100 of the display apparatus according to the embodiment of the present disclosure, the light generated by the first light-emitting layer 132 can be emitted to the outside through the first upper electrode 133.

First driving circuits can be disposed between the first device substrate 110 and each first light-emitting device 130. Each of the first driving circuits can be electrically connected to one of the first light-emitting devices 130. Each of the first driving circuits can generate a driving current corresponding to a data signal according to a gate signal, and provide to the corresponding first light-emitting device 130. Each of the first driving circuits can include at least one first thin film transistor 120. For example, the first thin film transistor 120 can include a first gate electrode 121, a first gate insulating layer 122, a first semiconductor pattern 123, a first source electrode 124 and a first drain electrode 125.

The first gate electrode 121 can be disposed close to the first device substrate 110. For example, the first gate electrode 121 can be in direct contact with the second substrate layer 113. The first gate electrode 121 can include a conductive material. For example, the first gate electrode 121 can include a metal, such as aluminum (Al), titanium (Ti), copper (Cu), chrome (Cr), molybdenum (Mo) and/or tungsten (W).

The first gate insulating layer 122 can be disposed on the first gate electrode 121. The first gate insulating layer 122 can extend beyond the first gate electrode 121. For example, a side of the first gate electrode 121 can be covered by the first gate insulating layer 122. The first gate insulating layer 122 can include an insulating material. For example, the first gate insulating layer 122 can include an inorganic insulating material, such as silicon oxide (SiO) and silicon nitride (SiN). The first gate insulating layer 122 can include a material having high dielectric constant. For example, the first gate insulating layer 122 can include a High-K material, such as hafnium oxide (HfO). The first gate insulating layer 122 can have a multi-layer structure.

The first semiconductor pattern 123 can be disposed on the first gate insulating layer 122. The first semiconductor pattern 123 can include a semiconductor material. For example, the first semiconductor pattern 123 can include amorphous silicon (a-Si) or polycrystalline silicon (poly-Si). The first semiconductor pattern 123 can be an oxide semiconductor. For example, the first semiconductor pattern 123 can include a metal oxide, such as IGZO. The first semiconductor pattern 123 can include a source region, a drain region and a channel region. The channel region can be disposed between the source region and the drain region. The source region and the drain region can have a resistance lower than the channel region. The first semiconductor pattern 123 can be insulated from the first gate electrode 121 by the first gate insulating layer 122. The channel region of the first semiconductor pattern 123 can overlap the first gate electrode 121. For example, the channel region of the first semiconductor pattern 123 can have electrical conductivity corresponding to a voltage applied to the first gate electrode 121.

The first source electrode 124 can include a conductive material. For example, the first source electrode 124 can include a metal, such as aluminum (Al), titanium (Ti), copper (Cu), chrome (Cr), molybdenum (Mo) and/or tungsten (W). The first source electrode 124 can be insulated from the first gate electrode 121 by the first gate insulating layer 122. For example, the first source electrode 124 can include a material different than the first gate electrode 121. The first source electrode 124 can be electrically connected to the source region of the first semiconductor pattern 123. An end of the first source electrode 124 can be in direct contact with the source region of the first semiconductor pattern 123.

The first drain electrode 125 can include a conductive material. For example, the first drain electrode 125 can include a metal, such as aluminum (Al), titanium (Ti), copper (Cu), chrome (Cr), molybdenum (Mo) and tungsten (W). The first drain electrode 125 can be insulated from the first gate electrode 121 by the first gate insulating layer 122. For example, the first drain electrode 125 can include a material different than the first gate electrode 121. The first drain electrode 125 can be disposed on the same layer as the first source electrode 124. For example, the first drain electrode 125 can include the same material as the first source electrode 124. The first drain electrode 125 can be electrically connected to the drain region of the first semiconductor pattern 123. The first drain electrode 125 can be spaced away from the first source electrode 124. For example, an end of the first drain electrode 125 can be in direct contact with the drain region of the first semiconductor pattern 123.

A first lower passivation layer 101 can be disposed between the first thin film transistors 120 and the first light-emitting devices 130. The first lower passivation layer 101 can prevent the damage of the first thin film transistors 120 due to external impacts and moisture. For example, an upper surface of each first thin film transistor 120 opposite to the first device substrate 110 can be covered by the first lower passivation layer 101. The first lower passivation layer 101 can include an insulating material. For example, the first lower passivation layer 101 can include an inorganic material, such as silicon oxide (SiO) and silicon nitride (SiN).

A first over-coat layer 102 can be disposed on the first lower passivation layer 101 and the first light-emitting devices 130. The first over-coat layer 102 can remove a thickness difference due to the first driving circuits. For example, an upper surface of the first over-coat layer 102 facing toward the first light-emitting devices 130 can be a flat surface. The first over-coat layer 102 can include an insulating material. For example, the first over-coat layer 102 can include an organic insulating material. Thus, in each of the first display panels 100 of the display apparatus according to the embodiment of the present disclosure, the thickness difference due to the first driving circuits can be effectively removed.

The first light-emitting devices 130 can be disposed on the first over-coat layer 102. For example, the first lower electrode 131, a first light-emitting layer 132 and a first upper electrode 133 of each first light-emitting device 130 can be sequentially stacked on the first over-coat layer 102. The first lower electrode 131 of each first light-emitting device 130 can be electrically connected to one of the first thin film transistors 120. For example, the first lower passivation layer 101 and the first over-coat layer 102 can include first electrode contact holes partially exposing the first drain electrode 125 of each first thin film transistor 120. The first lower electrode 131 of each first light-emitting device 130 can be connected to the first drain electrode 125 of the corresponding first thin film transistor 120 through one of the first electrode contact holes.

A first bank insulating layer 103 can be disposed on the first over-coat layer 102. The first bank insulating layer 103 can include an insulating material. For example, the first bank insulating layer 103 can include an organic insulating material. The first bank insulating layer 103 can include a material different than the first over-coat layer 102. The first bank insulating layer 103 can cover an edge of each first lower electrode 131. The first light-emitting layer 132 and the first upper electrode 133 of each first light-emitting device 130 can be stacked on a portion of the corresponding first lower electrode 131 exposed by the first bank insulating layer 103.

Light emitted from each first light-emitting device 130 can display a color different than light emitted from adjacent first light-emitting device 130 (e.g., red, green or blue). For example, the first light-emitting layer 132 of each first light-emitting device 130 can include a material different than the first light-emitting layer 132 of adjacent first light-emitting device 130. The first light-emitting layer 132 of each first light-emitting device 130 can be spaced away from the first light-emitting layer 132 of adjacent first light-emitting device 130. For example, the first light-emitting layer 132 of each light-emitting device 130 can include an end on the first bank insulating layer 103.

A voltage applied to the first upper electrode 133 of each first light-emitting device 130 can be the same as a voltage applied to the first upper electrode 133 of adjacent first light-emitting device 130. For example, the first upper electrode 133 of each first light-emitting device 130 can be electrically connected to the first upper electrode 133 of adjacent first light-emitting device 130. The first upper electrode 133 of each first light-emitting device 130 can include the same material as the first upper electrode 133 of adjacent first light-emitting device 130. For example, the first upper electrode 133 of each first light-emitting device 130 can be in contact with the first upper electrode 133 of adjacent first light-emitting device 130.

A first encapsulating element 140 can be disposed on the first light-emitting devices 130. The first encapsulating element 140 can prevent the damage of the light-emitting devices 130 due to external impacts and moisture. The first encapsulating element 140 can have a multi-layer structure. For example, the first encapsulating element 140 can include a first lower encapsulating layer 141, a first intermediate encapsulating layer 142 and a first upper encapsulating layer 143, which are sequentially stacked. The first lower encapsulating layer 141, the first intermediate encapsulating layer 142 and the first upper encapsulating layer 143 can include an insulating material. The first intermediate encapsulating layer 142 can include a material different than the first lower encapsulating layer 141 and the first upper encapsulating layer 143. For example, the first lower encapsulating layer 141 and the first upper encapsulating layer 143 can include an inorganic insulating material, and the first intermediate encapsulating layer 142 can include an organic insulating material. Thus, in the display apparatus according to the embodiment of the present disclosure, damage of the first light-emitting devices 130 due to external impacts and moisture can be effectively prevented. A thickness difference due to the first light-emitting devices 130 can be removed by the first intermediate encapsulating layer 142. For example, an upper surface of the first encapsulating element 140 opposite to the first device substrate 110 can be a flat surface.

The first device substrate 110 can include a display area AA and a bezel area BA. The image provided to the user can be generated from the display area AA of each display panel 100. For example, the driving circuits and the first light-emitting devices 130 can be disposed on the display area AA of the first device substrate 110. The bezel area BA of each first display panel 100 can provide a signal for realizing the image to the display area AA of the corresponding first display panel 100. For example, a panel driver can be disposed in the bezel area BA of each first display panel 100. The panel driver can apply the gate signal and/or the data signal to each driving circuit. For example, the panel driver can include at least one signal thin film transistor 170. The signal thin film transistor 170 can have the same structure as the first thin film transistors 120. For example, the signal thin film transistor 170 can include a signal gate electrode 171, a signal gate insulating layer 172, a signal semiconductor pattern 173, a signal source electrode 174 and a signal drain electrode 175.

The signal thin film transistor 170 can be simultaneously formed with the first thin film transistors 120. For example, the signal thin film transistor 170 can be disposed between the first device substrate 110 and the first lower passivation layer 101. The signal gate electrode 171 can include the same material as the first gate electrode 121. The signal gate insulating layer 172 can include the same material as the first gate insulating layer 122. The signal semiconductor pattern 173 can include the same material as the first semiconductor pattern 123. The signal source electrode 174 and the signal drain electrode 175 can include the same material as the first source electrode 124 and the first drain electrode 125. The first over-coat layer 102, the first bank insulating layer 103 and the first encapsulating element 140 can extend on the bezel area BA of the first device substrate 110.

A first parallel light generating element 150 can be disposed on the first encapsulating element 140 of each first display panel 100. The first parallel light generating element 150 can be disposed on the display area AA and the bezel area BA of the first device substrate 110. The light emitted from each first light-emitting device 130 can be converted to a first parallel light L1 by the first parallel light generating element 150. For example, the first parallel light generating element 150 can include first transparent lenses 151 on or over the first light-emitting devices 130 and a first lens planarization layer 152 covering the first transparent lenses 151. The first lens planarization layer 152 can include an insulating material. For example, the first lens planarization layer 152 can include an organic insulating material. The refractive index of the first lens planarization layer 152 can be less than the refractive index of each first transparent lens 151. Thus, each first display panel 100 of the display apparatus according to the embodiment of the present disclosure can prevent the light passing through the first transparent lenses 151 from being diffused by a difference in the refractive index between the first transparent lenses 151 and the first lens planarization layer 152.

The second display panel 200 can be disposed on the first display panels 100. The second display panel 200 can have a larger size than each of the first display panels 100. For example, each of the first display panels 100 can overlap a portion of the second display panel 200. The second display panel 200 can couple the images realized by the first light-emitting devices 130 of each first display panel 100. For example, the second display panel 200 can include at least one second light-emitting device 230 on a second device substrate 210. For example, the second display panel 200 can include sub-pixels that overlap the "dead space" due to the bezel areas in the first display panels 100, thus acting as a type of "bridge" that bridges the gaps, in order to provide one large uniform image to the user. Further in this example, the second display panel 200 can have large transparent areas that overlap with the active areas of the first display panels 100, and the second display panel 200 can have sub-pixels arranged along grid lines that overlap with the bezel areas between the first display panels 100.

The second device substrate 210 can include an insulating material. The second device substrate 210 can include a transparent material. For example, the second device substrate 210 can include glass or plastic. The second device substrate 210 can include an emission area EA and a transmission area TA. The transmission area TA of the second device substrate 210 can overlap the display area AA of each first device substrate 110. For example, the first parallel light L1 emitted from the display area AA of each first display panel 100 can pass through the transmission area TA of the second device substrate 210. The emission area EA of the second device substrate 210 can overlap the bezel area BA of each first device substrate 110. The bezel area BA of each first display panel 100 can be contact with the bezel area BA of adjacent display panel 100. For example, the emission area EA of the second device substrate 210 can overlap a boundary of the first display panels 100. For example, the second display panel 200 can have large transparent areas that overlap with the active areas of the first display panels 100 (e.g., so the image from the first display panels 100 can shine through), and the second display panel 200 can have sub-pixels arranged along grid lines that overlap with the bezel areas between the first display panels 100 (e.g., thus filling any gaps in the image due to the bezel areas of the display panels 100).

The second light-emitting device 230 can be disposed on the emission area EA of the second device substrate 210. The second light-emitting device 230 can be spaced away from the transmission area TA of the second device substrate 210. Thus, in the display apparatus according to the embodiment of the present disclosure, the image by the first light-emitting devices 130 of each first display panel 100 is cannot affected by the second light-emitting device 230. The second light-emitting device 230 can emit light displaying a specific color. The second light-emitting device 230 can have a stacked structure same as the first light-emitting devices 130. For example, the second light-emitting device 230 can include a second lower electrode 231, a second light-emitting layer 232 and a second upper electrode 233, which are sequentially stacked.

The second lower electrode 231 can include a conductive material. The second lower electrode 231 can include a material having high reflectance. For example, the second lower electrode 231 can include a metal, such as aluminum (Al) and silver (Ag). The second lower electrode 231 can have a multi-layer structure. For example, the second lower electrode 231 can have a structure in which a reflective electrode formed of a metal is disposed between transparent electrodes formed of a transparent conductive material, such as ITO and IZO.

The second light-emitting layer 232 can generate light having luminance corresponding to a voltage difference between the second lower electrode 231 and the second upper electrode 233. For example, the second light-emitting layer 232 can include an emission material layer (EML). For example, the second display panel 200 of the display apparatus according to the embodiment of the present disclosure can be an organic light-emitting display panel including the light-emitting layer formed of an organic material. The second light-emitting layer 232 can have a multi-layer structure. For example, the second light-emitting layer 232 can further include at least one of a hole injection layer (HIL), a hole transport layer (HTL), an electron transport layer (ETL) and an electron injection layer (EIL). Therefore, in the second display panel 200 of the display apparatus according to the embodiment of the present disclosure, the luminous efficiency of the second light-emitting devices 230 can be improved.

The second upper electrode 233 can include a conductive material. The second upper electrode 233 can include a material different than the second lower electrode 231. The second upper electrode 233 can have a transparency higher than the second lower electrode 231. For example, the second upper electrode 233 can be a transparent electrode consisting of a transparent conductive material, such as ITO and IZO. Thus, in the second display panel 200 of the display apparatus according to the embodiment of the present disclosure, the light generated by the second light-emitting layer 232 can be emitted to the outside through the second upper electrode 233.

A second driving circuit can be disposed between the second device substrate 210 and the second light-emitting device 230. The second driving circuit can be electrically connected to the second light-emitting device 230. The second driving circuit can generate a driving current corresponding to a data signal according to a gate signal, and provide to the second light-emitting device 230. The second driving circuit can include at least one second thin film transistor 220. For example, the second thin film transistor 220 can include a second semiconductor pattern 221, a second gate insulating layer 222, a second gate electrode 223, an interlayer insulating layer 224, a second source electrode 225 and a second drain electrode 226.

The second semiconductor pattern 221 can be disposed close to the second device substrate 210. The second semiconductor pattern 221 can include a semiconductor material. For example, the second semiconductor pattern 221 can include amorphous silicon (a-Si) or polycrystalline silicon (poly-Si). The second semiconductor pattern 221 can be an oxide semiconductor. For example, the second semiconductor pattern 221 can include a metal oxide, such as IGZO. The second semiconductor pattern 221 can have the same configuration as the first semiconductor pattern 123. For example, the second semiconductor pattern 221 can include a source region, a drain region and a channel region.

The second gate insulating layer 222 can be disposed on the second semiconductor pattern 221. The second gate insulating layer 222 can extend beyond the second semiconductor pattern 221. For example, a side of the second semiconductor pattern 221 can be covered by the second gate insulating layer 222. The second gate insulating layer 222 can include an insulating material. For example, the second gate insulating layer 222 can include an inorganic insulating material, such as silicon oxide (SiO) and silicon nitride (SiN). The second gate insulating layer 222 can include a material having a high dielectric constant. For example, the second gate insulating layer 222 can include a high-K material, such as hafnium oxide (HfO). The second gate insulating layer 222 can have a multi-layer structure.

The second gate electrode 223 can be disposed on the second gate insulating layer 222. The second gate electrode 223 can include a conductive material. For example, the second gate electrode 223 can include a metal, such as aluminum (Al), titanium (Ti), copper (Cu), chrome (Cr), molybdenum (Mo) and tungsten (W). The second gate electrode 223 can be insulated from the second semiconductor pattern 221 by the second gate insulating layer 222. The second gate electrode 223 can overlap the channel region of the second semiconductor pattern 221. For example, the channel region of the second semiconductor pattern 221 can have electrical conductivity corresponding to a voltage applied to the second gate electrode 223.

The interlayer insulating layer 224 can be disposed on the second gate electrode 223. The interlayer insulating layer 224 can extend beyond the second gate electrode 223. For example, a side of the second gate electrode 223 can be covered by the interlayer insulating layer 224. The interlayer insulating layer 224 can be in direct contact with the second gate insulating layer 222 at the outside of the second gate electrode 223. The interlayer insulating layer 224 can include an insulating material. For example, the interlayer insulating layer 224 can include an inorganic insulating material, such as silicon oxide (SiO) and silicon nitride (SiN).

The second source electrode 225 can be disposed on the interlayer insulating layer 224. The second source electrode 225 can include a conductive material. For example, the second source electrode 225 can include a metal, such as aluminum (Al), titanium (Ti), copper (Cu), chrome (Cr), molybdenum (Mo) and tungsten (W). The second source electrode 225 can be insulated from the second gate electrode 223 by the interlayer insulating layer 224. For example, the second source electrode 225 can include a material different than the second gate electrode 223. The second source electrode 225 can be electrically connected to the source region of the second semiconductor pattern 221. For example, the second gate insulating layer 222 and the interlayer insulating layer 224 can include a source contact hole partially exposing the source region of the second semiconductor pattern 221. The second source electrode 225 can include a portion overlapping with the source region of the second semiconductor pattern 221. For example, the second source electrode 225 can be in direct contact with the source region of the second semiconductor pattern 221 within the source contact hole.

The second drain electrode 226 can be disposed on the interlayer insulating layer 224. The second drain electrode 226 can include a conductive material. For example, the second drain electrode 226 can include a metal, such as aluminum (Al), titanium (Ti), copper (Cu), chrome (Cr), molybdenum (Mo) and tungsten (W). The second drain electrode 226 can be insulated from the second gate electrode 223 by the interlayer insulating layer 224. For example, the second drain electrode 226 can include a material different than the second gate electrode 223. The second drain electrode 226 can include the same material as the second source electrode 225. The second drain electrode 226 can be electrically connected to the drain region of the second semiconductor pattern 221. The second drain electrode 226 can be spaced away from the second source electrode 225. For example, the second gate insulating layer 222 and the interlayer insulating layer 224 can include a drain contact hole partially exposing the drain region of the second semiconductor pattern 221. The second drain electrode 226 can include a portion overlapping with the drain region of the second semiconductor pattern 221. For example, the second drain electrode 226 can be in direct contact with the drain region of the second semiconductor pattern 221 within the drain contact hole.

A buffer insulating layer 201 can be disposed between the second device substrate 210 and the second driving circuit. The buffer insulating layer 201 can prevent pollution due to the second device substrate 210 in a process of forming the second thin film transistor 220. For example, the buffer insulating layer 201 can completely cover an upper surface of the second device substrate 210 toward the second driving circuit. The buffer insulating layer 201 can include an insulating material. For example, the buffer insulating layer 201 can include an inorganic insulating material, such as silicon oxide (SiO) and silicon nitride (SiN).

A light-blocking pattern 215 can be disposed between the buffer insulating layer 201 and the second thin film transistor 220. The light-blocking pattern 215 can prevent characteristics change of the second thin film transistor 220 due to the light emitted from the first display panels 100. For example, the light-blocking pattern 215 can include a portion overlapping with the second semiconductor pattern 221 of the second thin film transistor 220. The light-blocking pattern 215 can include a material that blocks or absorbs the light. For example, the light-blocking pattern 215 can include a metal, such as aluminum (Al), silver (Ag) and copper (Cu).

A second lower passivation layer 202 can be disposed on the second driving circuit. The second lower passivation layer 202 can prevent the damage of the second driving circuit due to external impacts and moisture. For example, an upper surface of the second thin film transistor 220 opposite to the second device substrate 210 can be covered by the second lower passivation layer 202. The second lower passivation layer 202 can include an insulating material. For example, the second lower passivation layer 202 can include an inorganic material, such as silicon oxide (SiO) and silicon nitride (SiN).

A second over-coat layer 203 can be disposed on the second lower passivation layer 202. The second over-coat layer 203 can remove a thickness difference due to the second driving circuit. For example, an upper surface of the second over-coat layer 203 opposite to the second device substrate 210 can be a flat surface. The second over-coat layer 203 can include an insulating material. The second over-coat layer 203 can include a material different than the second lower passivation layer 202. For example, the second over-coat layer 203 can include an organic insulating material.

The second light-emitting device 230 can be disposed on the second over-coat layer 203. For example, the second lower electrode 231, a second light-emitting layer 232 and a second upper electrode 233 of the second light-emitting device 230 can be sequentially stacked on the second over-coat layer 203. The second lower electrode 231 of the second light-emitting device 230 can be electrically connected to the second thin film transistor 220. For example, the second lower passivation layer 202 and the second over-coat layer 203 can include second electrode contact hole partially exposing the second drain electrode 226 of the second thin film transistor 220. The second lower electrode 231 of the second light-emitting device 230 can be connected to the second drain electrode 226 of the second thin film transistor 220 through the second electrode contact hole.

A second bank insulating layer 204 can be disposed on the second over-coat layer 203. The second bank insulating layer 204 can include an insulating material. For example, the second bank insulating layer 204 can include an organic insulating material. The second bank insulating layer 204 can include a material different than the second over-coat layer 203. The second bank insulating layer 204 can cover an edge of the second lower electrode 231. The second light-emitting layer 232 and the second upper electrode 233 of the second light-emitting device 230 can be stacked on a portion of the second lower electrode 231 exposed by the second bank insulating layer 204. The transmission area TA of the second device substrate 210 may not overlap the bank insulating layer 204. For example, the bank insulating layer 204 can be disposed outside of the transmission area TA. Thus, in the second display panel 200 of the display apparatus according to the embodiment of the present disclosure, the transmittance of the transmission area TA can be increased.

A second encapsulating element 240 can be disposed on the second light-emitting device 230. The second encapsulating element 240 can prevent the damage of the second light-emitting device 230 due to external impacts and moisture. The second encapsulating element 240 can have a multi-layer structure. For example, the second encapsulating element 240 can include a second lower encapsulating layer 241, a second intermediate encapsulating layer 242 and a second upper encapsulating layer 243, which are sequentially stacked. The second lower encapsulating layer 241, the second intermediate encapsulating layer 242 and the second upper encapsulating layer 243 can include an insulating material. The second intermediate encapsulating layer 242 can include a material different than the second lower encapsulating layer 241 and the second upper encapsulating layer 243. For example, the second lower encapsulating layer 241 and the second upper encapsulating layer 243 can include an inorganic insulating material, and the second intermediate encapsulating layer 242 can include an organic insulating material. Thus, in the display apparatus according to the embodiment of the present disclosure, the damage of the second light-emitting device 230 due to external impact and moisture can be prevented. A thickness difference due to the second light-emitting device 230 can be removed by the second intermediate encapsulating layer 242. For example, an upper surface of the second encapsulating element 240 opposite to the second device substrate 210 can be a flat surface.

A second parallel light generating element 250 can be disposed on the second encapsulating element 240. The second parallel light generating element 250 can be disposed on the emission area EA and the transmission area TA of the second device substrate 210. The light emitted from the second light-emitting device 230 can be converted to a second parallel light L2 by the second parallel light generating element 250. The second parallel light generating element 250 can have the same configuration as the first parallel light generating element 150. For example, the second parallel light generating element 250 can include a second transparent lens 251 on the second light-emitting device 230 and a second lens planarization layer 252 covering the second transparent lens 251. The second lens planarization layer 252 can include an insulating material. For example, the second lens planarization layer 252 can include an organic insulating material. The refractive index of the second lens planarization layer 252 can be less than the refractive index of the second transparent lens 251. Thus, the second display panel 200 of the display apparatus according to the embodiment of the present disclosure can prevent the light passing through the second transparent lens 251 from being diffused by a difference in the refractive index between the second transparent lens 251 and the second lens planarization layer 252.

The diffusion sheet 300 can be disposed on the second display panel 200. For example, the first parallel light L2 passing through the first parallel light generating element 150 of each first display panel 100 can enter the diffusion sheet 300 after passing through the transmission area TA of the second display panel 200. The light generated by the second light-emitting device 230 of the second display panel 200 can enter the diffusion sheet 300 after being converted to the second parallel light L2 by the second parallel light generating element 250. The first parallel light L1 and the second parallel light L2 can be diffused by the diffusion sheet 300 to realize the large-size image provided to the user.

Accordingly, the display apparatus according to the embodiment of the present disclosure can include the first display panels 100 which are disposed side by side, and the second display panel 200 on top of the first display panels 100, in which each of the first display panels 100 can include the display area AA in which the first light-emitting devices 130 and the first transparent lenses 151 are stacked, and the bezel area BA disposed outside the display area AA, in which the second display panel 200 can include the transmission area TA overlapping with the display area AA of each first display panel 100 and the emission area EA overlapping with the bezel area BA of each first display panel 100, and in which the at least one second light-emitting device 230 can be disposed in the emission area EA of the second display panel 200. For example, the second display panel 200 can have large transparent areas that overlap with the active areas of the first display panels 100 (e.g., so the image from the first display panels 100 can shine through), and the second display panel 200 can have sub-pixels arranged along grid lines that overlap with the bezel areas between the first display panels 100 (e.g., thus filling any gaps in the image due to the bezel areas of the display panels 100). Thus, in the display apparatus according to the embodiment of the present disclosure, the large-size uniform image provided to the user can be realized by the light which is emitted from the display area AA of each first display panel 100 and passes through the transmission area TA of the second display panel 200, and the light emitted from the emission area EA of the second display panel 200. Therefore, the display apparatus according to the embodiment of the present disclosure can provide the large-size uniform image to the user without degradation of the quality and the resolution due to the bezel areas BA of each the first display panels 100.

And, in the display apparatus according to the embodiment of the present disclosure, the light emitted from each first light-emitting device 130 can be converted to the first parallel light L1 by the first parallel light generating element 150, the light emitted from the second light-emitting device 230 can be converted to the second parallel light L2 by the second parallel light generating element 250, and the first parallel light L1 and the second parallel light L2 can be diffused by the diffusion sheet 300 which is disposed on the second display panel 200. Thus, in the display apparatus according to the embodiment of the present disclosure, the user can recognize the viewing distance of the image realized by the display panels 100 to be the same as the viewing distance of the image realized by the second display panel 200. For example in the display apparatus according to the embodiment of the present disclosure, the user may not feel any sense of discontinuity or incongruity at the boundary between the image realized by the first display panels 100 and the image realized by the second display panel 200. Therefore, the display apparatus according to the embodiment of the present disclosure can provide a large-size uniform image of high quality to the user without any sense of discontinuity or incongruity.

The display apparatus according to the embodiment of the present disclosure is described that the second thin film transistor 220 of the second display panel 200 has a structure different than the first thin film transistor 120 of each first display panel 100 and the signal thin film transistor 170. However, in the display apparatus according to another embodiment of the present disclosure, at least one of the first thin film transistor 120 of each first display panel 100 and the signal thin film transistor 170 can have the same structure as the second thin film transistor 220 of the second display panel 200. For example, in the display apparatus according to another embodiment of the present disclosure, the first thin film transistor 120 of each first display panel 100 can include a first semiconductor pattern 123 disposed between the first device substrate 110 and the first gate electrode 121. Thus, in the display apparatus according to another embodiment of the present disclosure, the degree of freedom for configuration of the first display panels and the second display panel can be improved.

Figure 4:
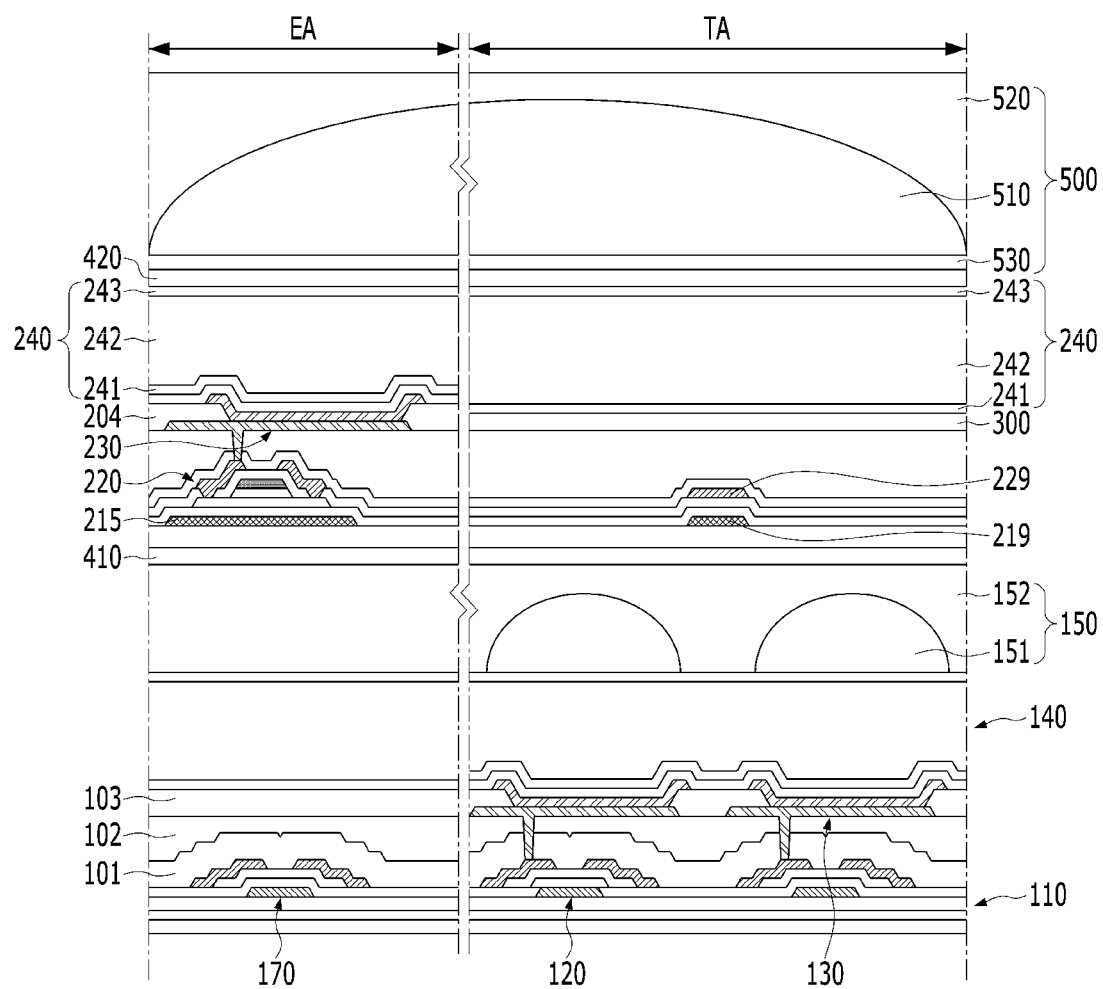
FIGS. 4 and 5 are views showing a display apparatus according another embodiment of the present disclosure.

The display apparatus according to the embodiment of the present disclosure is described that the second display panel 200 is spaced away from the first display panels 100. However, in the display apparatus according to another embodiment of the present disclosure, the first display panels 100 can be coupled with the second display panel 200. For example, in the display apparatus according to another embodiment of the present disclosure, a substrate adhesive layer 410 can be disposed between the first parallel light generating element 150 and the second device substrate 210, as shown in FIG. 4. The substrate adhesive layer 410 can be in direct contact with the lens planarization layer 152 of the first parallel light generating element 150 and the second device substrate 210. For example, the second device substrate 210 can be attached to the first parallel light generating element 150 by the substrate adhesive layer 410. Thus, in the display apparatus according to another embodiment of the present disclosure, loss of the light between each first display panel 100 and the second display panel 200 can be minimized.

The display apparatus according to the embodiment of the present disclosure is described that the second display panel 200 includes the second parallel light generating element 250 which is disposed on the second light-emitting device 230, the diffusion sheet 300 includes a portion overlapping with the emission area EA of the second display panel 200. However, in the display apparatus according to another embodiment of the present disclosure, the diffusion sheet 300 may not overlap the emission area EA of the second display panel 200.

FIG. 4 is a view showing a display apparatus according another embodiment of the present disclosure.

Referring FIG. 4, for example, the second display panel of the display apparatus according to the embodiment of the present disclosure can include the diffusion sheet 300 which is disposed side by side with the second light-emitting device 230. For example, the diffusion sheet 300 can be disposed between the second over-coat layer 203 and the second encapsulating element 240. Thus, in the display apparatus according to another embodiment of the present disclosure, the light being converted to the first parallel light by the first parallel light generating element can have a view-point same as the light generated by the second light-emitting device 230. Therefore, the display apparatus according to another embodiment of the present disclosure can effectively provide the large-size image without a sense of incongruity to the user.

In the display apparatus according to another embodiment of the present disclosure, signal wires 219 and 229 can be disposed on the transmission area TA of the second display panel. The signal wires 219 and 229 can be disposed between the first light-emitting devices 130 of each first display panel 100. For example, the signal wires 219 and 229 can overlap the first bank insulating layer 103 of each first display panel. Thus, in the display apparatus according to another embodiment of the present disclosure, loss of light due to the signal wires 219 and 229 of the second display panel can be prevented. Therefore, in the display apparatus according to another embodiment of the present disclosure, the quality of the realized large-size image can be improved.

In the display apparatus according to another embodiment of the present disclosure, a 3D optical element 500 can be disposed on the diffusion sheet 300. Thus, the display apparatus according to another embodiment of the present disclosure can provide the large-size image of high quality to the user. For example, the 3D optical element 500 can include lenticular lenses 510 and a lens passivation layer 520 covering the lenticular lenses 510. Each of the lenticular lenses 510 can have a horizontal width larger than each first transparent lens 151 of the first parallel light generating element 150. For example, each of the lenticular lenses 510 can overlap a plurality of the first light-emitting devices 130. The lens passivation layer 520 can include an insulating material. For example, the lens passivation layer 520 can include an organic insulating material. A thickness difference due to the lenticular lenses 510 can be removed by the lens passivation layer 520. For example, an outer surface of the lens passivation layer 520 toward the user can be a flat surface. The 3D optical element 500 can further include a polarizer 530 on a lower surface of each lenticular lens 510 toward the second encapsulating element 240. Therefore, in the display apparatus according to another embodiment of the present disclosure, the degradation in the quality of the realized large-size image due to the reflection of the external light can be prevented.

The 3D optical element 500 can be attached to the second display panel. For example, an optical adhesive layer 420 can be disposed between the second encapsulating element 240 and the 3D optical element 500. The optical adhesive layer 420 can be in direct contact with the second upper encapsulating layer 243 of the second encapsulating element 240 and the polarizer 530. Thus, in the display apparatus according to another embodiment of the present disclosure, loss of the light between the second display panel and the 3D optical element 500 can be prevented.

The display apparatus according to the embodiment of the present disclosure is described that each of the parallel light generating elements 150 and 250 includes the transparent lenses 151 and 251. However, the display apparatus according to another embodiment of the present disclosure can convert the light emitted from the light-emitting devices 130 and 230 to the parallel light by various methods.

Figure 5:
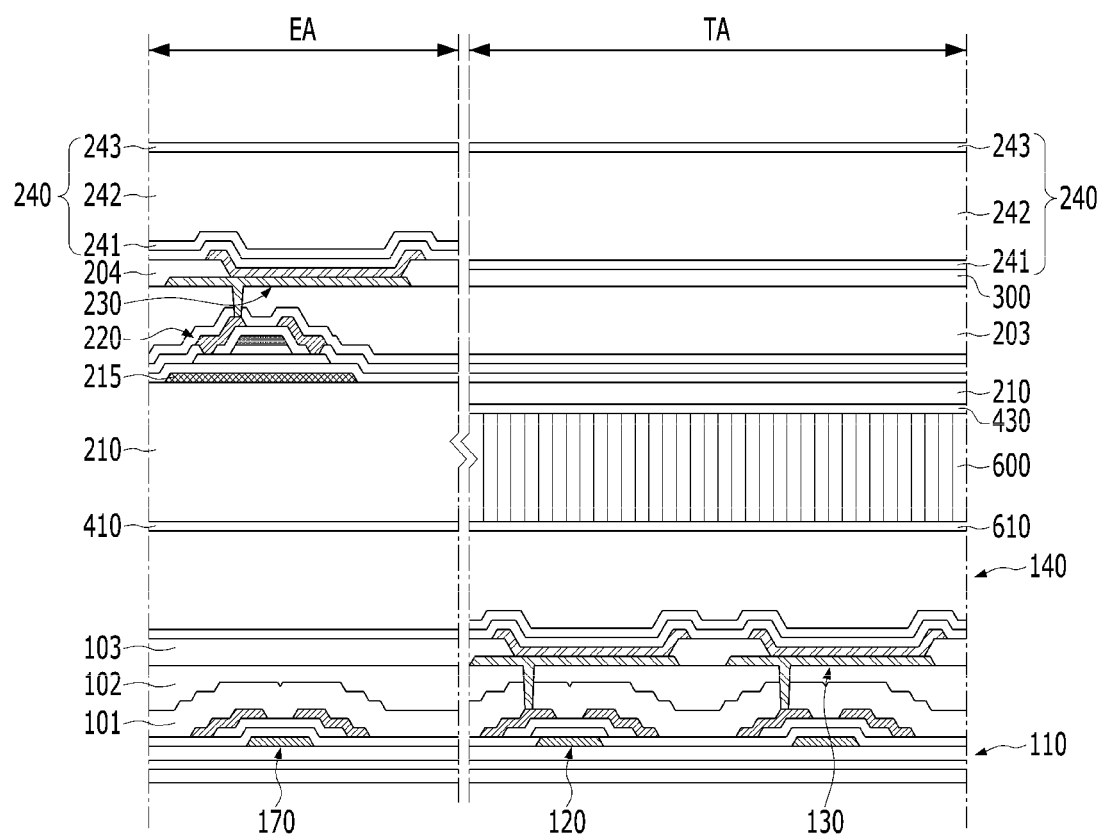

FIG. 5 is a view showing a display apparatus according another embodiment of the present disclosure.

Referring to FIG. 5, for example, in the display apparatus according to another embodiment of the present disclosure, the first parallel light generating element 600 on the first light-emitting devices 130 of each first display panel can include glass fiber which extends toward the second device substrate of the second display panel from the first encapsulating element 140 of the corresponding first display panel. The first parallel light generating element 600 made of glass can be attached to the first encapsulating element 140 by a fiber adhesive layer 610. Thus, in the display apparatus according to another embodiment of the present disclosure, the degree of freedom for the parallel light generating element 600 can be improved.

In the display apparatus according to another embodiment of the present disclosure, the emission area EA and the transmission area TA of the second device substrate 210 can have different thicknesses. For example, the transmission area TA of the second device substrate 210 can have a thickness thinner than the emission area EA of the second device substrate 210. The first parallel light generating element 600 of each first display panel 100 can be disposed only on the first light-emitting devices 130 of the corresponding first display panel. For example, the first parallel light generating element 600 of each first display panel may not overlap the emission area EA of the second device substrate 210. The first parallel light generating element 600 of each first display panel can be attached to the transmission area TA of the second device substrate 210. For example, a transparent adhesive layer 430 can be disposed between the first parallel light generating element 600 of each first display panel and the transmission area TA of the second device substrate 210. The transparent adhesive layer 430 can be in direct contact with the first parallel light generating element 600 of each first display panel and the second device substrate 210. The thickness difference between the transmission area TA and the emission area EA of the second device substrate 210 can be the same as a thickness of the first parallel light generating element 600 of each first display panel.

For example in the display apparatus according to another embodiment of the present disclosure, the first parallel light generating element 600 of each first display panel can be completely inserted into and/or contained within the second display panel. The second display panel can include the diffusion sheet 300 which is disposed side by side with the second light-emitting device 230. Thus, in the display apparatus according to another embodiment of the present disclosure, the overall thickness can be decreased. Therefore, in the display apparatus according to another embodiment of the present disclosure, portability can be improved, and the large-size image of high resolution can be effectively provided to the user.

As a result, the display apparatus according to the embodiments of the present disclosure can include the first display panel having the display area and the bezel area and the second display panel having the transmission area and the emission area, in which the display area of the first display panel in which the first light-emitting device and the parallel light generating element are stacked can overlap the transmission area of the second display panel, in which the emission area of the second display panel in which the second light-emitting device is disposed can overlap the bezel area of the first display panel, and in which the light emitted from each first light-emitting device can be converted to the parallel light by the parallel light generating element. Thus, in the display apparatus according to the embodiments of the present disclosure, the large-size image of high quality can be realized without any sense of discontinuity or incongruity. Thereby, in the display apparatus according to the embodiments of the present disclosure, the quality of the large-size uniform image provided to the user can be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display apparatus comprising:
a first device substrate including a display area and a bezel area disposed outside of the display area;
first light-emitting devices disposed in the display area of the first device substrate;
a first encapsulating element disposed on the first light-emitting devices;
a second device substrate disposed on the first encapsulating element, the second device substrate including a transmission area overlapping with the display area of the first device substrate and an emission area overlapping with the bezel area of the first device substrate;
at least one second light-emitting device disposed in the emission area of the second device substrate; and
a parallel light generating element disposed between the first encapsulating element and the second device substrate,
wherein the parallel light generating element is configured to convert light emitted from at least one of the first light-emitting devices to parallel light.

2. The display apparatus according to claim 1, further comprising a substrate adhesive layer disposed between the parallel light generating element and the second device substrate.

3. The display apparatus according to claim 1, wherein the parallel light generating element includes:
transparent lenses disposed on the first light-emitting devices, and
a lens planarization layer covering the transparent lenses.

4. The display apparatus according to claim 3, wherein a refractive index of the lens planarization layer is less than a refractive index of each of the transparent lenses.

5. The display apparatus according to claim 3, further comprising:

a diffusion sheet disposed on the second device substrate, the diffusion sheet overlapping with the display area of the first device substrate.

6. The display apparatus according to claim 5, wherein the diffusion sheet is spaced apart from the emission area of the second device substrate.

7. The display apparatus according to claim 5, further comprising:
a second encapsulating element disposed on the second device substrate, the second encapsulating element covering the at least one second light-emitting device,
wherein the diffusion sheet is disposed between the second device substrate and the second encapsulating element.

8. The display apparatus according to claim 1, further comprising a signal wire disposed on the second device substrate,
wherein the signal wire is disposed between adjacent first light-emitting devices among the first light-emitting devices or over an area located between the adjacent first light-emitting devices.

9. The display apparatus according to claim 1, further comprising a three-dimensional (3D) optical element disposed on the at least one second light-emitting device,
wherein the 3D optical element extends across at least a portion of the transmission area of the second device substrate.

10. The display apparatus according to claim 9, wherein the 3D optical element includes one or more lenticular lenses and a lens passivation layer covering the one or more lenticular lenses.

11. A display apparatus comprising:
first display panels disposed side by side, each of the first display panels including a display area and a bezel area; and
a second display panel disposed on the first display panels,
wherein the second display panel includes a transmission area overlapping with the display area of each of the first display panels, and an emission area overlapping with the bezel area of each of the first display panels, and
wherein a plurality of first light-emitting devices and a parallel light generating element are disposed in the display area of each of the first display panels.

12. The display apparatus according to claim 11, wherein the parallel light generating element of each of the first display panels includes glass fiber extending toward the second display panel from the corresponding first display panel.

13. The display apparatus according to claim 11, wherein the second display panel includes at least one second light-emitting device disposed in the emission area and a device substrate supporting the at least one second light-emitting device, and wherein the transmission area of the device substrate has a thickness thinner than a thickness of the emission area of the device substrate.

14. The display apparatus according to claim 13, wherein the parallel light generating element is spaced apart from the bezel area of the corresponding first display panel, and
wherein a thickness difference between the transmission area and the emission area is approximately equal to a thickness of the parallel light generating element.

15. The display apparatus according to claim 13, wherein the second display panel includes a thin film transistor electrically connected to the at least one second light-emitting device, and a light-blocking pattern disposed between the device substrate and a semiconductor pattern of the thin film transistor, and
wherein the thin film transistor and the light-blocking pattern are spaced apart from the transmission area.

16. A display apparatus comprising:
a plurality of first display panels arranged in a grid, the plurality of first display panels including display areas having a plurality of first sub-pixels and bezel areas free of sub-pixels; and
a second display panel stacked on the plurality of first display panels, and including emission areas and transparent transmission areas,
wherein the emission areas of the second display panel include a plurality of second sub-pixels arranged in a grid overlapping with the bezel areas of the first display panels, and
wherein the transparent transmission areas of the second display panel overlap with the plurality of first sub-pixels in the plurality of first display panels.

17. The display apparatus according to claim 16, wherein the second display panel and the plurality of first display panels together are configured to display one uniform image.

18. The display apparatus according to claim 16, further comprising:
a first parallel light generating element disposed between the second display panel and at least one of the plurality of first sub-pixels,
wherein the first parallel light generating element is configured to convert light emitted from the at least one of the plurality of first sub-pixels to parallel light.

19. The display apparatus according to claim 18, further comprising:
a second parallel light generating element disposed over at least one of the plurality of second sub-pixels, and configured to convert light emitted from the at least one of the plurality of second sub-pixels to parallel light,
wherein the second parallel light generating element overlaps with the first parallel light generating element.

20. The display apparatus according to claim 16, wherein the second display panel is larger than each of the plurality of first display panels.

* * * * *